United States Patent [19]
Kato et al.

[11] Patent Number: 5,742,175
[45] Date of Patent: Apr. 21, 1998

[54] METHOD OF EVALUATING A DENSITY OF OXYGEN-PRECIPITATION DEFECTS IN A SILICON WAFER

[75] Inventors: Hirotaka Kato; Kei Matsumoto, both of Hiratsuka, Japan

[73] Assignee: Komatsu Electronic Metals, Inc., Hiratsuka, Japan

[21] Appl. No.: 603,081

[22] Filed: Feb. 20, 1996

[51] Int. Cl.$^6$ .................................. G01R 31/26
[52] U.S. Cl. ............................................. 324/765
[58] Field of Search ................... 324/765, 766–769; 437/8; 257/40, 48

[56] References Cited

U.S. PATENT DOCUMENTS

| | | | |
|---|---|---|---|
| 4,342,616 | 8/1982 | Elliott et al. | 324/71.5 |
| 5,066,599 | 11/1991 | Kaneta et al. | 437/7 |
| 5,471,293 | 11/1995 | Lowell et al. | 356/30 |

Primary Examiner—Ernest F. Karlsen
Assistant Examiner—Russell M. Kobert
Attorney, Agent, or Firm—Varndell Legal Group

[57] ABSTRACT

An evaluation method to efficiently and precisely measure high-density oxygen-precipitation defects in the bulk of a silicon wafer is disclosed. A number of silicon wafers containing oxygen-precipitation defects are provided. The SPV method is utilized to measure the diffusion length of the minority carriers in the silicon wafers. The density of oxygen-precipitation defects is measured by the infrared tomography method. The diffusion length and the defect density are plotted and are found to be correlated. That is, the SPV measured diffusion length of the minority carriers and the defect density obtained by the infrared tomography method have specific relationships. A constant A can then be obtained from the plot. The diffusion length L of minority carriers in silicon wafers provided for evaluation is measured by the SPV method. Finally, the bulk oxygen-precipitation defects density can be calculated from the formula A×L$^{-2}$. The present invention can precisely obtain the defect density in very short time. Moreover, the bulk density can be obtained since the silicon wafers need not be broken.

3 Claims, 1 Drawing Sheet

METHOD OF EVALUATING A DENSITY OF OXYGEN-PRECIPITATION DEFECTS IN A SILICON WAFER

BACKGROUND OF THE INVENTION

1. Field of the Invention

The present invention relates to a method of evaluating a density of oxygen-precipitation defects in a silicon wafer.

2. Description of Related Arts

Several methods, such as the etching method and the infrared tomography method, have been developed for evaluating oxygen-precipitation defects in a silicon wafer. When the etching method is utilized, a silicon wafer is broken along a cleavage plane, and then the cross section is etched and observed. In general, for the etching method, the oxygen-precipitation defects are observed and counted by eye through a microscope. For the infrared method, after breaking the silicon wafer along the cleavage plane, infrared light is irradiated upon the cross section, and the scattered diffracted light is measured to calculate the number of defects.

As mentioned above, since the number of defects are observed and counted by human eye through the microscope when the etching method is utilized, a great deal of error may occur in the observation, thus causing considerable variance in the measurement result. Moreover, only the defects on the cross section of the silicon wafer are measured by the etching method. That is, oxygen-precipitation defects inside the bulk of the silicon wafer cannot be evaluated. Therefore, the result cannot represent a real profile of the silicon wafer since the measurement does not account for all the defects therein. The same problem exists with the infrared tomography method. Therefore, it is almost impossible to evaluate precisely a lateral distribution of oxygen-precipitation defects in the silicon wafer by the conventional methods.

SUMMARY OF THE INVENTION

Accordingly, the present invention provides an evaluation method to measure high-density oxygen-precipitation defects in the bulk of a silicon wafer.

The present invention also provides a method for evaluating a density of oxygen-precipitation defects in a silicon wafer efficiently and precisely.

The method evaluates oxygen-precipitation defects in silicon wafers according to the present invention in which both side surface thereof are covered with non-defect zone layers. The method is characterized in that after removing the non-defect-zone layers from one or both surfaces of the silicon wafer, the surface photovoltage (SPV) method is utilized to measure the diffusion length L of minority carriers in the silicon wafer, and the density of oxygen-precipitation defects is obtained by substituting a constant A into the formula $A \times L^{-2}$.

In the present invention, the constant A is a predetermined value which is obtained from the relationship between the SPV measured diffusion length of minority carrier and an oxygen-precipitation defect density obtained from the infrared tomography method.

Moreover, the SPV method is applied on the exposed surface where the non-defect zone layer has been removed to measure the diffusion length of the minority carriers.

As mentioned above, since the constant A is predetermined from the relationship between the SPV measured diffusion length of minority carrier and an oxygen-precipitation defect density measured previously by the infrared tomography method, and the diffusion length L of the minority carriers is measured by using the SPV method, the oxygen-precipitation defect density can be obtained efficiently and precisely from the formula $A \times L^{-2}$. Moreover, since the silicon wafer need not be broken when the SPV method is utilized, a distribution of oxygen-precipitation defect in the bulk can be easily obtained.

Other objects, features, and advantages of the present invention will become apparent from the following detailed description of the preferred but non-limiting embodiment.

BRIEF DESCRIPTION OF THE DRAWINGS

The description is made with reference to the accompanying drawings in which:

FIGS. 2A–2C are cross-sectional views illustrating the procedure for evaluating the oxygen-precipitation defect density; wherein FIG. 2A illustrates a silicon wafer with non-defect zone layers provided for evaluation; FIG. 2B illustrates the wafer from which non-defect zone layers has been removed; and FIG. 2C illustrates the wafer in which the diffusion length of minority carriers is measured.

DETAILED DESCRIPTION OF THE INVENTION

Figure 1:
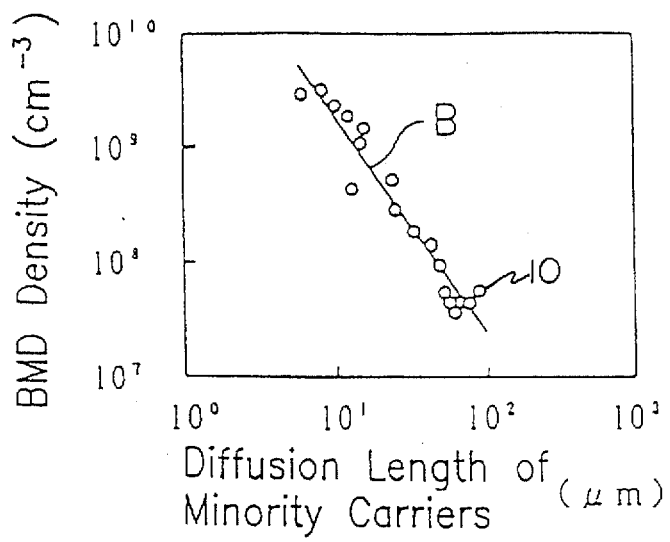
FIG. 1 is a schematic diagram illustrating the relationships between the SPV measured diffusion length of the minority carriers and the oxygen-precipitation defect density obtained by the infrared tomography method.

The preferred embodiment of the present invention will now be described in accompaniment with FIG. 1 and FIGS. 2A through 2C. Referring to FIG. 1, the relationships between the diffusion length of minority carriers and the oxygen-precipitation defect density are illustrated. The diffusion length of minority carriers is measured by the surface photovoltage (SPV) method and the oxygen-precipitation defect density obtained by the infrared tomography method. Since the present invention measures the bulk oxygen-precipitation microdefect density instead of the oxygen-precipitation defects on the cross section of the silicon wafer, the oxygen-precipitation defect density is briefly presented as BMD density in the figure and in the following descriptions.

In order to obtain the plot shown in FIG. 1, a number of silicon wafers which contain oxygen-precipitation defects are examined. The surfaces of these silicon wafers are covered with non-defect zone layers. After removal of these non-defect zone layers, the diffusion length of minority carriers is measured by the SPV method. Next, each of the silicon wafers is broken along a cleavage plane for BMD density measurement by the infrared tomography method. It is obvious that the measured results correlate, as shown in the line B on FIG. 1 where the circles 10 represent a BMD density measurement at various diffusion lengths. That is, the SPV measured diffusion length of the minority carriers and the BMD density obtained by the infrared tomography method have some specific relationships. Therefore, a constant A, by which the BMD density can be transformed from the SPV measured diffusion length of the minority carriers, can be obtained from the plot of FIG. 1. For example, in the preferred embodiment of the present invention, as shown in FIG. 1, a number of P-type Boron-doped silicon wafers are evaluated, and the constant A has a value of $1.9 \times 10^{11}$ ($\mu m^2/cc$).

Since the constant A depends on the impurities, such as dopants which contribute shallow levels, in the silicon wafers, the plot has to be modified if the types of silicon wafers for evaluation are changed. That is, new relationships between the BMD density and the SPV measured diffusion length of the minority carriers must be plotted again in the figure, and a new constant A should be found for density calculation.

Figure 2A:
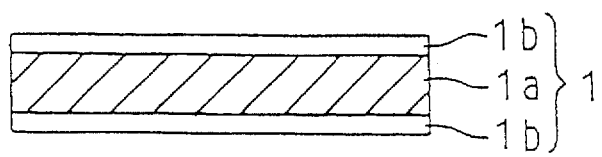
Figure 2B:
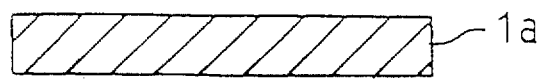
Figure 2C:
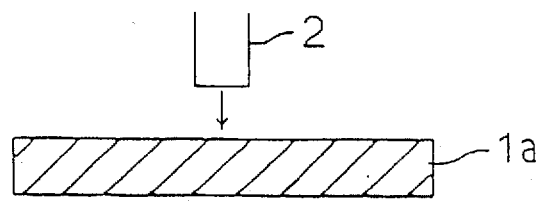

FIGS. 2A–2C are cross-sectional views schematically illustrating the procedure for evaluating the oxygen-precipitation defect density in silicon wafers. Referring to FIG. 2A, the silicon wafers 1 have been processed to provide the property of intrinsic gettering. Or they have, for example, been heated to a temperature of about 1000° C. for about 16 hours to form BMD inside the wafer 1a. The effective resistivity of the silicon wafers 1 is preferably higher than about 0.05 Ω.cm that suitable for measurement of the diffusion length of the minority carriers by the SPV method.

As shown in FIG. 2A, the surfaces of the silicon wafer 1a are covered with non-defect zone layers 1b. In order to measure the diffusion length of the minority carriers, the non-defect zone layers 1b on both sides of the silicon wafer, or that on only one side, are removed by chemical etching. Then referring to FIG. 2C, a probe 2 of a SPV instrument is applied upon the exposed surface where the non-defect zone layer has been removed. The SPV measured result, i.e., the diffusion length L of the minority carriers in the silicon wafers, are put into the following formula to calculate the BMD density:

$$[BMD(cm^{-3})] = A \times L^{-2}$$

In the present invention, the time required to obtain each point of the BMD density is about 6 seconds. The time is very short. Moreover, the SPV method differs from the etching method and the infrared tomography method which measure the BMD density on the cross section of the silicon wafers. That is, the SPV method can find the precise BMD density inside the silicon wafer by a mapping method.

As described above, in the present invention, the constant A is predetermined from the relationship between the SPV measured diffusion length of the minority carriers and an oxygen-precipitation defect density obtained by the infrared tomography method. The diffusion length L of the minority carriers is obtained by measuring the silicon wafer using the SPV method. Therefore, the oxygen-precipitation defect density can be obtained efficiently and precisely from the formula $A \times L^{-2}$. Moreover, since the silicon wafer need not to be broken when the SPV method is utilized, the bulk defect density can be easily obtained.

What is claimed is:

1. A method for evaluating oxygen-precipitation defects in a silicon wafer in which both side surfaces thereof are covered with non-defect layers and oxygen-precipitation defects exist in the bulk of the silicon wafer, comprising the steps of:

determining a correlation between a diffusion length L of minority carriers and an oxygen-precipitation defect density to calculate a constant A having units of measure of $\mu m^2/cc$;

measuring the diffusion length L of minority carriers in the silicon wafer by using the surface photovoltage (SPV) method after removal of at least one of the non-defect layers; and calculating a density of oxygen-precipitation defects by substituting the constant A into a formula $A \times L^{-2}$.

2. The method for evaluating oxygen-precipitation defects in a silicon wafer as claimed in claim 1, wherein the constant A is a determined from the relationship between the SPV measured diffusion length of minority carriers and an oxygen-precipitation defect density obtained by the infrared tomography method.

3. The method for evaluating oxygen-precipitation defects in a silicon wafer as claimed in claim 1, wherein the SPV method is applied on an exposed surface where the non-defect layer has been removed to measure the diffusion length of the minority carriers.

* * * * *